US009568504B2

(12) United States Patent
Cabot et al.

(10) Patent No.: US 9,568,504 B2
(45) Date of Patent: Feb. 14, 2017

(54) DIGITAL MULTI-METER

(71) Applicant: Milwaukee Electric Tool Corporation, Brookfield, WI (US)

(72) Inventors: Benjamin Oliver Ryan Cabot, Seattle, WA (US); Evans H. Nguyen, Renton, WA (US)

(73) Assignee: MILWAUKEE ELECTRIC TOOL CORPORATION, Brookfield, WI (US)

( * ) Notice: Subject to any disclaimer, the term of this patent is extended or adjusted under 35 U.S.C. 154(b) by 285 days.

(21) Appl. No.: 14/212,156

(22) Filed: Mar. 14, 2014

(65) Prior Publication Data

US 2014/0266155 A1 Sep. 18, 2014

Related U.S. Application Data

(60) Provisional application No. 61/786,897, filed on Mar. 15, 2013.

(51) Int. Cl.
*G01R 15/12* (2006.01)
*G01R 15/09* (2006.01)

(52) U.S. Cl.
CPC ............ *G01R 15/125* (2013.01); *G01R 15/09* (2013.01)

(58) Field of Classification Search
None
See application file for complete search history.

(56) References Cited

U.S. PATENT DOCUMENTS

| | | | |
|---|---|---|---|
| 3,187,323 | A | 6/1965 | Flood et al. |
| 3,648,175 | A | 3/1972 | Barnard et al. |
| 3,812,334 | A | 5/1974 | Gollomp |
| 3,958,178 | A | 5/1976 | Mueller et al. |
| 4,105,967 | A | 8/1978 | Macemon |
| 4,200,933 | A | 4/1980 | Nickel et al. |
| 4,250,447 | A | 2/1981 | Lode |
| 4,337,517 | A | 6/1982 | Nickel et al. |
| RE31,606 | E | 6/1984 | Crosby |
| 4,761,606 | A | 8/1988 | Germer et al. |
| 4,825,143 | A | 4/1989 | Cheng |
| 4,864,512 | A | 9/1989 | Coulson et al. |
| 5,119,019 | A | 6/1992 | George |
| 5,142,221 | A | 8/1992 | Meldrum et al. |
| 5,166,599 | A | 11/1992 | Hochreuther et al. |
| 5,218,290 | A | 6/1993 | Beckert et al. |
| 5,278,493 | A | 1/1994 | Henkelmann |
| 5,349,289 | A | 9/1994 | Shirai |

(Continued)

*Primary Examiner* — Paresh Patel
(74) *Attorney, Agent, or Firm* — Michael Best & Friedrich LLP

(57) ABSTRACT

A multi-meter including a current input, a common input, a display, a first current measurement circuit, a second current measurement circuit, and a controller. The controller includes a first input and a second input. The controller operable to receive a first voltage from the first current measurement circuit at the first input, receive a second voltage from the second current measurement circuit at the second input, determine a value for a current being measured based on the first voltage if the first voltage is below a predetermined threshold, determine a value for a current being measured based on the second voltage if the first voltage is above the predetermined threshold, generate an output signal related to the determined value for the current, and provide the output signal to the display.

11 Claims, 4 Drawing Sheets

(56) References Cited

U.S. PATENT DOCUMENTS

| | | |
|---|---|---|
| 5,396,168 A | 3/1995 | Heep et al. |
| 5,432,706 A | 7/1995 | Meldrum et al. |
| 5,442,337 A | 8/1995 | Hwang |
| 5,557,197 A | 9/1996 | Schulze et al. |
| 5,570,259 A * | 10/1996 | Allmeier ............ G01R 15/09 361/115 |
| 5,581,175 A | 12/1996 | Yoneyama et al. |
| 5,600,255 A * | 2/1997 | Moore ............... G01R 27/14 324/537 |
| 5,619,129 A | 4/1997 | Kamiya |
| 5,920,188 A | 7/1999 | Voorheis et al. |
| 5,920,189 A | 7/1999 | Fisher et al. |
| 5,923,161 A | 7/1999 | Frankovitch, Jr. et al. |
| 6,043,640 A | 3/2000 | Lauby et al. |
| 6,218,824 B1 | 4/2001 | Oldstead et al. |
| 6,242,920 B1 | 6/2001 | Nelson et al. |
| 6,380,726 B1 | 4/2002 | Szabo |
| 6,466,003 B1 | 10/2002 | Gallavan et al. |
| 6,794,859 B2 | 9/2004 | Choi |
| 6,911,831 B2 | 6/2005 | Tsutsui |
| 6,985,819 B2 | 1/2006 | Lipscomb et al. |
| 7,098,648 B2 | 8/2006 | Krieger et al. |
| 7,439,725 B2 | 10/2008 | Fischer et al. |
| 7,746,092 B2 | 6/2010 | Li |
| 7,923,985 B2 | 4/2011 | Goeke et al. |
| 7,990,162 B2 | 8/2011 | Eng, Jr. |
| 7,991,568 B2 | 8/2011 | Zang et al. |
| 8,269,481 B2 | 9/2012 | Garland et al. |
| 2005/0073322 A1* | 4/2005 | Hibbs ................. A61B 5/04 324/658 |
| 2008/0048729 A1* | 2/2008 | Ehrenreich ......... G03F 7/70516 327/63 |
| 2009/0128127 A1 | 5/2009 | Garland et al. |
| 2009/0128128 A1 | 5/2009 | Garland et al. |
| 2010/0181990 A1 | 7/2010 | Hudson et al. |
| 2011/0221423 A1 | 9/2011 | Lund |
| 2011/0285414 A1 | 11/2011 | Eng, Jr. |
| 2013/0100734 A1* | 4/2013 | Kuo ................... G11C 16/28 365/185.2 |

* cited by examiner

DIGITAL MULTI-METER

RELATED APPLICATION

The present application claims priority to U.S. Provisional Application 61/786,897, filed Mar. 15, 2013, the entire contents of which are hereby incorporated.

FIELD OF INVENTION

The present invention relates to digital electronic measuring instruments that are used to measure voltage, current, and resistance, as well as other electrical properties.

SUMMARY

In one embodiment, the invention provides a multi-meter that includes a first input terminal, a second input terminal, a display, a first current measuring circuit between the first input terminal and the second input terminal, a second current measuring circuit between the first input terminal and the second input terminal, and a controller. The first current measuring circuit is operable to measure current in a first current range, and the second current measuring circuit is operable to measure current in a second current range. The controller includes a first current measuring input, a second current measuring input, a processor, and a memory. The controller is configured to receive a first signal from the first current measuring circuit at the first current measuring input, receive a second signal from the second current measuring circuit at the second current measuring input, compare the first signal to a predetermined threshold value, determine a value for a current being measured based on the first signal when the first signal is below the predetermined threshold value, determine a value for the current being measured based on the second signal when the first signal greater than or approximately equal to the predetermined threshold value, generate an output signal related to the determined value for the current, and provide the output signal to the display.

In another embodiment, the invention provides a method of measuring current in a first current range and a second current range. The method includes receiving a first signal at a first current input; receiving a second signal at a second current input; comparing the first signal to a predetermined threshold value; determining a value for a current being measured based on the first signal when the first signal is below the predetermined threshold value; determining a value for the current being measured based on the second signal when the first signal is greater than or approximately equal to the predetermined threshold value; and generating an output signal related to the determined value for the current.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
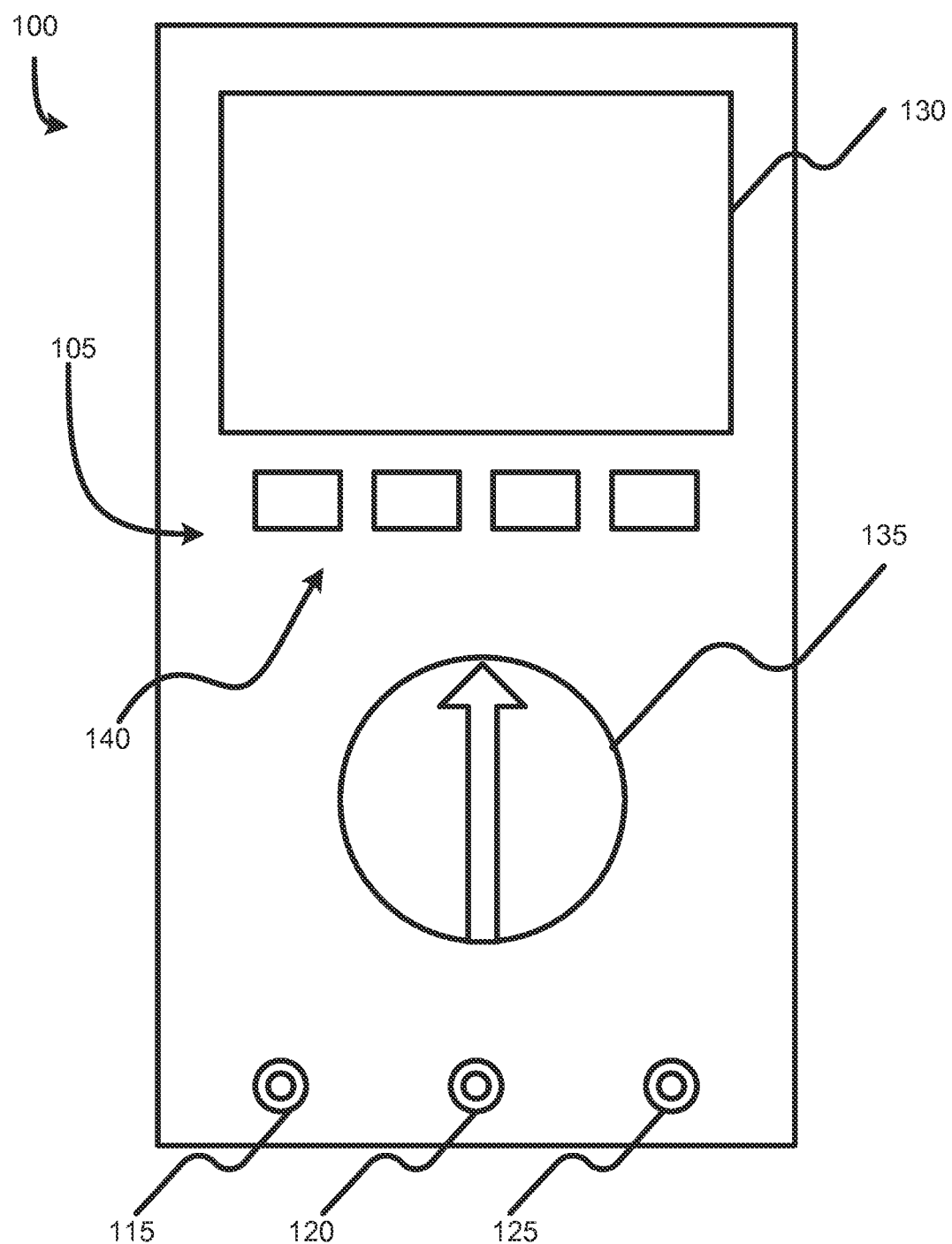
FIG. 1 illustrates a multi-meter according to an embodiment of the invention.

FIG. 1 illustrates a multi-meter 100, which is used to measure, for example, voltage, current, resistance, frequency, capacitance, and temperature, as well as other electrical properties. In one embodiment, as shown in FIG. 1, the multi-meter 100 is a digital multi-meter, although in other embodiments, the multi-meter 100 is an analog multi-meter. The multi-meter 100 is configured to be hand-held (e.g., using one hand) by a user during operation. The multi-meter 100 includes a user-interface 105, a current input terminal 115, a common input terminal 120, and a general input terminal 125. In some embodiments, the user-interface 105 comprises a display 130, a dial 135, and one or more buttons 140. The display 130 is a liquid crystal display ("LCD"), such as a negative LCD ("NLCD") with an electroluminescent backlight, but may alternatively be another suitable type of display. In some embodiments, the user-interface 105 comprises a touch-screen.

Figure 2:
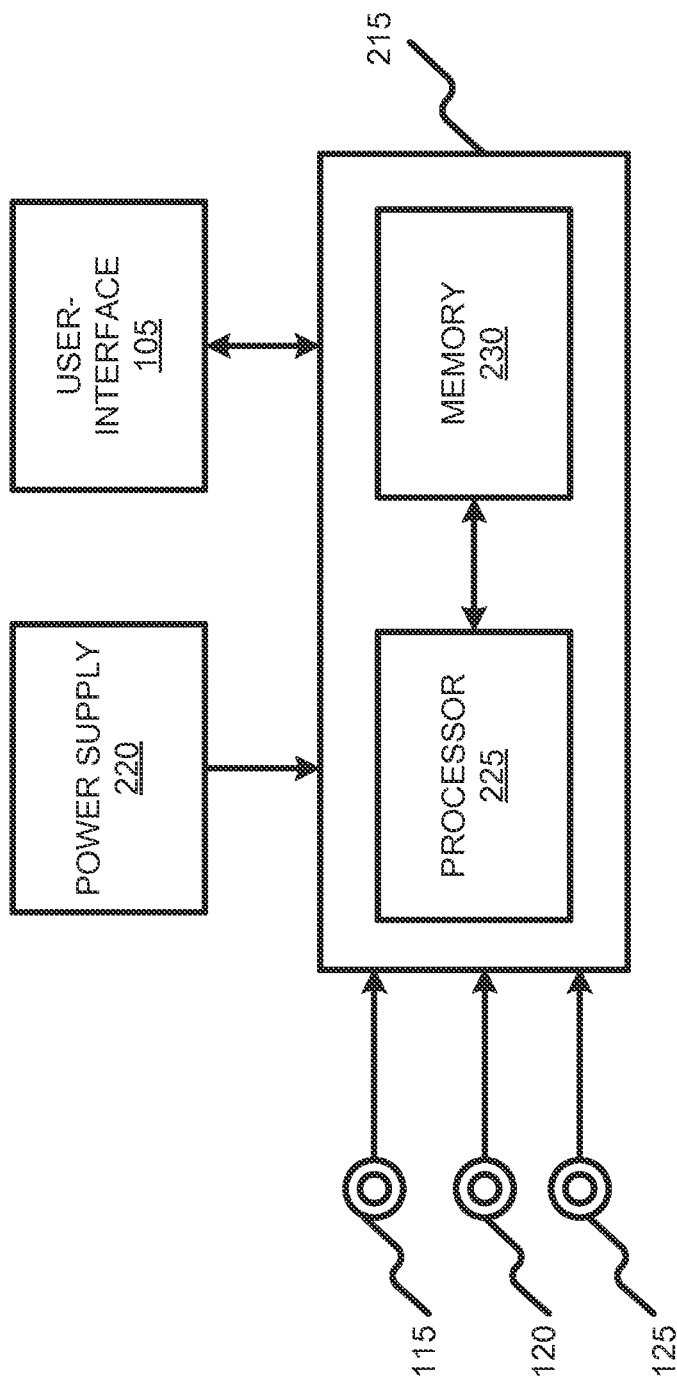
FIG. 2 illustrates a controller of the multi-meter of FIG. 1 according to an embodiment of the invention.

FIG. 2 illustrates a controller or output device 215 of the multi-meter 100. The controller 215 is electrically and/or communicatively connected to a variety of modules or components of the multi-meter 100. For example, the controller 215 is connected to one or more inputs (e.g., current input terminal 115, common input terminal 120, and general input terminal 125), the user-interface 105, and a power supply 220. The controller 215 includes combinations of hardware and software that are operable to, among other things, control the operation of the multi-meter 100, process information received from inputs, and display the processed information. Additionally, although shown as being directly coupled in FIG. 2, there may be additional components connected in between the controller 215 and the current input terminal 115, common input terminal 120, and general input terminal 125.

In some embodiments, the controller 215 includes a plurality of electrical and electronic components that provide power, operational control, and protection to the components and modules within the controller 215 and/or multi-meter 100. For example, the controller 215 includes, among other things, a processing unit 225 (e.g., a microprocessor, a microcontroller, or another suitable programmable device), a memory 230, and inputs. In some embodiments, the controller 215 is implemented partially or entirely on a semiconductor (e.g., a field-programmable gate array ["FPGA"] semiconductor) chip, such as a chip developed through a register transfer level ("RTL") design process.

The memory 230 includes, for example, a program storage area and a data storage area. The program storage area and the data storage area can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processing unit 225 is connected to the memory 230 and executes software instructions that are capable of being stored in a RAM of the memory 230 (e.g., during execution), a ROM of the memory 230 (e.g., on a generally permanent basis), or another non-transitory computer readable medium such as another memory or a disc. Software included in the implementation of the multi-meter 100 can be stored in the memory 230 of the controller 215. The software includes, for example, firmware, one or more applications, program data, filters, rules, one or more program modules, and other executable instructions. The controller 215 is configured to retrieve from memory and execute, among other things, instructions related to the control processes and methods described herein. In other embodiments, the controller 215 includes additional, fewer, or different components.

The power supply module 220 supplies a nominal DC voltage to the controller 215 or other components or modules of the multi-meter 100. In some embodiments, the power supply module 220 is powered by, for example, a power source (e.g., batteries or a battery pack) having nominal voltage of approximately 3V, 6V, 12V, or between 3V and 12V. The power supply module 220 is also configured to supply lower voltages to operate circuits and components within the controller 215 or multi-meter 100.

The user-interface 105 is operable to control the multi-meter 100 and display the results of measurements performed by the multi-meter 100. For example, a user selects a measurement setting using the dial 135 of the user-interface 105. The multi-meter 100 performs the selected measurement and outputs the measured value via the display 130. In some embodiments, the multi-meter 100 further receives control commands from the one or more buttons 140.

As discussed above, the multi-meter 100 can perform a variety of electrical measurements, including, for example, voltage, current, resistance, frequency, capacitance, inductance, temperature, etc. In operation, a user connects a common, or ground, node to the common input terminal 120. If current is to be measured, the user connects an ampere node to the current input terminal 115. If a different electrical property is to be measured (e.g., voltage, resistance, etc.), the user connects a node to the general input terminal 125, rather than the current input terminal 115. The user then selects the desired electrical property to be measured using the user-interface 105. In some embodiments, to select the desired electrical property the user rotates the dial 105 to the appropriate electrical property selection. A signal related to or indicative of the result of the electrical property measurement can then be provided to or communicated to the user via the user-interface 105. In some embodiments, the result of the electrical property measurement is displayed via the display 130. In other embodiments, the result of the electrical property measurement is communicated audibly via speakers.

Figure 3:
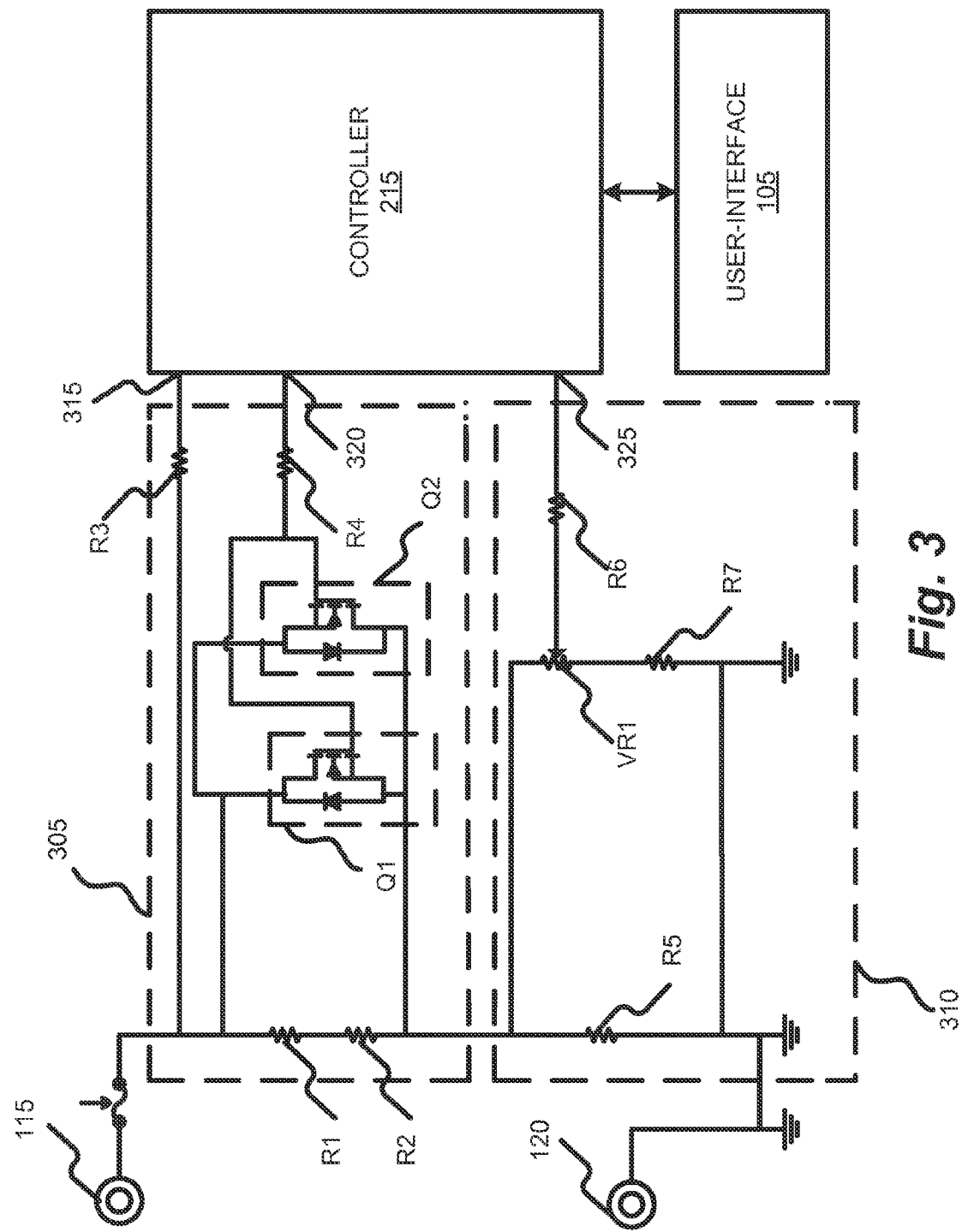
FIG. 3 is a circuit diagram illustrating a current measuring circuit of the multi-meter of FIG. 1 according to an embodiment of the invention.

FIG. 3 is a circuit diagram illustrating a current measuring circuit 300 of the multi-meter 100. The current measuring circuit 300 determines if the current being measured is in a high-current range or a low-current range and correspondingly switches between a high-current (e.g., ampere) measurement mode and a low-current (e.g., milli-ampere) measurement mode. The current measuring circuit 300 includes the current input terminal 115, common input terminal 120, controller 215, a first current measuring circuit 305, a second current measuring circuit 310, and a measurement mode control output 320. In some embodiments, the first current measuring circuit 305 is used to measure current that is less than or approximately equal to approximately one ampere (e.g., in a range of approximately 1 $\mu A$-1 A), while the second current measuring circuit 310 is used to measure current that is greater than or approximately equal to one ampere (e.g., in a range of approximately 1 A-10 A).

The first current measuring circuit 305 includes resistor R1, resistor R2, resistor R3, resistor R4, switch Q1, and switch Q2. In some embodiments, switches Q1 and Q2 are transistors (e.g., FETs, MOSFETs, power MOSFETs, etc.). The second current measuring circuit 310 includes resistor R5, resistor R6, resistor R7, and variable resistor VR1. Resistors R3, R4, R6, R7, and variable resistor VR1 are used, for example, for calibration purposes or for isolating the controller from the measured currents. In some embodiments, the switches Q1 and Q2 are in parallel with the resistors R1 and R2. In such embodiments, when the switches Q1 and Q2 are in an off state, current flows through the resistors R1 and R2. When the switches Q1 and Q2 are in an on state, current flows through the switches Q1 and Q2, bypassing the resistors R1 and R2.

The controller 215 receives a first current measuring input 315 from the first current measuring circuit 305 and a second current measuring input 325 from the second current measuring circuit 310. The controller 215 outputs a signal (e.g., a control voltage) from output 320, to control switches Q1 and Q2. The first current measuring input 315 corresponds to the voltage drop across resistors R1, R2, and R5, when switches Q1 and Q2 are off. The voltage measured by the controller 215 at the first current measuring input 315 is used to control the operational state of the switches Q1 and Q2. If the voltage measured at the first current measuring input 315, by the controller 215, is less than a predetermined threshold (e.g., approximately 0.1 0.5V, 1V, 1.5V, 2V, 2.5V, 3V, 3.5V, 4V, 4.5V, 5V, or another value between approximately 0.1V and 5V), the controller 215 will maintain the switches Q1 and Q2 in an off state. Thus, the current is measured by the controller 215 using the voltage received at the first current measuring input 315 (the voltage at the second current measuring input 325 is continually received but ignored by the controller 215 when in the first current measuring mode), which corresponds to the voltage drop across resistors R1, R2, and R5. Resistors R1, R2, and R5 have known values, and the current passing through them can be calculated by the controller 215. If the voltage measured at the first current measuring input 315, by the controller 215, is equal to or greater than the predetermined threshold, the controller 215 turns switches Q1 and Q2 to an on state and automatically switches from the first current measurement mode to the second current measurement mode. The resistors R1 and R2 are then bypassed (e.g., jumped, shorted, etc.), and current flows only through resistor R5. When this occurs, the current is measured by the controller 215 using the voltage received at the second current measuring input 325 (the voltage at the first current measuring input 315 is continually received but ignored by the controller 215 when in the second current measuring mode), which corresponds to the voltage drop across resistor R5.

In some embodiments, because the controller 215 always receives signals from the first current measuring circuit 305 and signals from the second current measuring circuit 310, the use of expensive and bulky relays or other elaborate and space-consuming electrical components can be avoided. Thus, some embodiments of the switching circuit 300 do not include relays or other electrical components that may be a detriment to the hand-held operation of the multi-meter 100.

Figure 4:
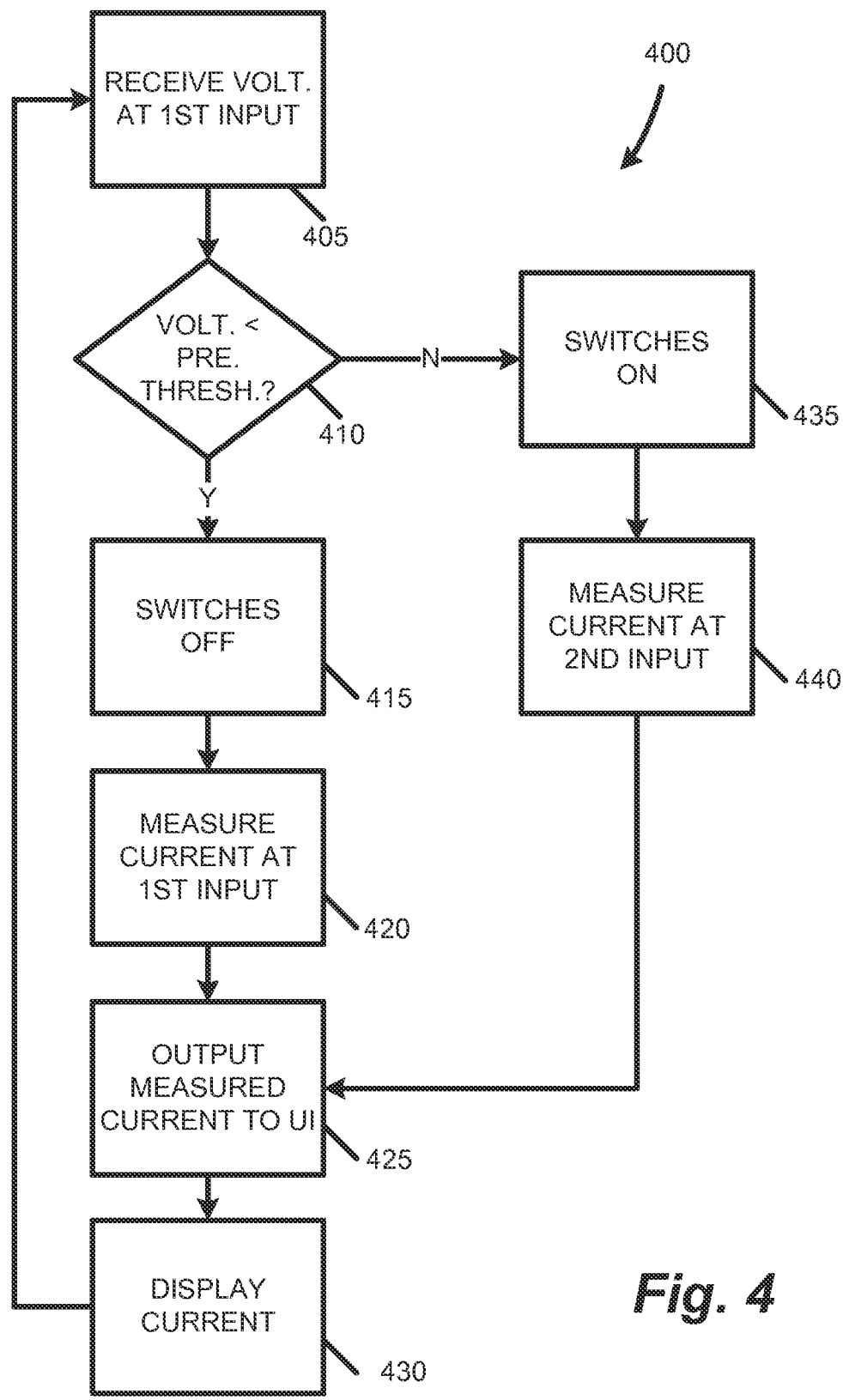
FIG. 4 is a process for a current measurement operation of the multi-meter according to an embodiment of the invention.

FIG. 4 illustrates a current measurement process or operation 400 of the multi-meter 100. The controller 215 receives a voltage input at the first current measuring input 315 (Step 405). The controller 215 evaluates the voltage input at the first current measuring input 315 and determines if the received voltage is less than the predetermined threshold (Step 410). If the received voltage is less than the predetermined threshold, the controller 215 outputs a signal, from output 320, to place or maintain switches Q1 and Q2 in an off state (Step 415). The controller 215 then measures the current based on the voltage received at the first current measuring input 315 (Step 420), and outputs the result of the current measurement (e.g., the controller 215 outputs a signal related or indicative of a value for the measured current) to the user-interface 105 (Step 425). The user-interface 105 then displays the result of the current measurement on the display 130 (Step 430). If, at Step 410, the received voltage is equal to or greater than the predetermined threshold, the controller 215 outputs a signal, from the output 320, to place or maintain the switches Q1 and Q2 in an on state (Step 435). The controller 215 then measures the current based on the voltage received at the second current measuring input 325 (Step 440). The operation 400 then proceeds to Step 425 where the result of the current measurement is output (e.g., the controller 215 outputs a signal related or indicative of a value for the measured current) and Step 430 where the user interface 105 displays the result of the current measurement. Once the measured current is displayed via the user-interface (Step 430), the operation returns to Step 405.

Thus, the invention provides, among other things, a multi-meter that automatically switches between a first current measurement mode and a second current measurement mode. Various features and advantages of the invention are set forth in the following claims.

What is claimed is:

1. A multi-meter comprising:
    a first input terminal;
    a second input terminal;
    a display;
    a first current measuring circuit between the first input terminal and the second input terminal, the first current measuring circuit operable for measuring current in a first current range;
    a second current measuring circuit between the first input terminal and the second input terminal, the second current measuring circuit operable for measuring current in a second current range; and
    a controller including a first current measuring input, a second current measuring input, a processor, and a memory, the controller configured to
        receive a first signal from the first current measuring circuit at the first current measuring input,
        receive a second signal from the second current measuring circuit at the second current measuring input,
        compare the first signal to a predetermined threshold value,
        determine a value for a current being measured based on the first signal when the first signal is below the predetermined threshold value,
        determine a value for the current being measured based on the second signal when the first signal is greater than or approximately equal to the predetermined threshold value,
        generate an output signal related to the determined value for the current, and
        provide the output signal to the display.

2. The multi-meter of claim 1, wherein the multi-meter is a hand-held multi-meter.

3. The multi-meter of claim 1, further comprising a third input terminal, the controller further configured to
    receive an electrical property selection input from a user-interface,
    receive a third signal related to the electrical property selection,
    determine a value for an electrical property based on the third signal, and
    generate a second output signal related to the value for the electrical property.

4. The multi-meter of claim 3, wherein the electrical property is one of a voltage, a resistance, an inductance, a capacitance, a frequency, and a temperature.

5. The multi-meter of claim 1, wherein the predetermined threshold is between approximately 0.1 volts and approximately 5.0 volts.

6. The multi-meter of claim 1, wherein the value for a current being measured based on the first signal is less than or approximately equal to one ampere.

7. The multi-meter of claim 6, where the value for a current being measured based on the second signal is greater than or approximately equal to one ampere.

8. The multi-meter of claim 1, wherein the controller is further configured to automatically switch between current measurement using the first current measuring circuit and current measurement using the second current measuring circuit.

9. The multi-meter of claim 1, wherein the first current measuring circuit includes a first switch and a second switch.

10. The multi-meter of claim 9, wherein the first switch and the second switch are connected in parallel.

11. The multi-meter of claim 9, wherein the first switch and the second switch are in an ON state when the first signal is greater than or approximately equal to the predetermined threshold value.

* * * * *